(12) United States Patent
Xu et al.

(10) Patent No.: US 12,328,993 B2
(45) Date of Patent: Jun. 10, 2025

(54) DISPLAY SUBSTRATE WITH MULTIPLE VIA HOLES, ELECTRONIC DEVICE, AND METHOD OF MANUFACTURING THE DISPLAY SUBSTRATE

(71) Applicant: BOE Technology Group Co., Ltd., Beijing (CN)

(72) Inventors: Pan Xu, Beijing (CN); Zhidong Yuan, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 616 days.

(21) Appl. No.: 17/762,147

(22) PCT Filed: May 10, 2021

(86) PCT No.: PCT/CN2021/092713
§ 371 (c)(1),
(2) Date: Mar. 21, 2022

(87) PCT Pub. No.: WO2022/236559
PCT Pub. Date: Nov. 17, 2022

(65) Prior Publication Data
US 2023/0006177 A1 Jan. 5, 2023

(51) Int. Cl.
*H10K 59/124* (2023.01)
*H10K 50/81* (2023.01)
(Continued)

(52) U.S. Cl.
CPC ........... *H10K 59/124* (2023.02); *H10K 50/81* (2023.02); *H10K 50/844* (2023.02); *H10K 71/00* (2023.02); *H10K 59/179* (2023.02)

(58) Field of Classification Search
CPC ...... H10K 50/844; H10K 50/81; H10K 71/00; H10K 59/179; H10K 59/124
See application file for complete search history.

(56) References Cited

U.S. PATENT DOCUMENTS 10,439,165 B2 10/2019 Kim et al.
10,916,723 B2 2/2021 Lee et al.
(Continued)

FOREIGN PATENT DOCUMENTS

CN 107665950 A 2/2018
CN 109712994 A 5/2019
(Continued)

*Primary Examiner* — Marcos D. Pizarro
*Assistant Examiner* — Tiberiu Dan Onuta
(74) *Attorney, Agent, or Firm* — Westman, Champlin & Koehler, P.A.

(57) ABSTRACT

A display substrate, a method of manufacturing a display substrate, and an electronic device are provided. The display substrate includes: a base substrate; a thin film transistor arranged on the base substrate; a first planarization layer arranged on a side of the thin film transistor away from the base substrate; a first protective layer arranged on a side of the first planarization layer away from the base substrate; a first conductive layer arranged on a side of the first protective layer away from the base substrate; and a second planarization layer arranged on a side of the first conductive layer away from the base substrate, wherein the display substrate is provided with a first via hole penetrating the first protective layer, and the first planarization layer is in contact with the second planarization layer through the first via hole.

18 Claims, 7 Drawing Sheets

(51) Int. Cl.
    *H10K 50/844*     (2023.01)
    *H10K 59/179*     (2023.01)
    *H10K 71/00*     (2023.01)

(56) References Cited

U.S. PATENT DOCUMENTS

| | | | |
|---|---|---|---|
| 11,069,268 B2 * | 7/2021 | Niu | H10K 59/131 |
| 11,449,163 B2 * | 9/2022 | Park | G06F 3/0448 |
| 2018/0033998 A1 | 2/2018 | Kim et al. | |
| 2018/0061918 A1 | 3/2018 | Park et al. | |
| 2018/0097044 A1 * | 4/2018 | Choi | H10K 59/131 |
| 2020/0136077 A1 | 4/2020 | Lee et al. | |
| 2020/0381348 A1 * | 12/2020 | Chang | H05K 1/0298 |
| 2022/0093895 A1 | 3/2022 | Zhang et al. | |

FOREIGN PATENT DOCUMENTS

| | | | |
|---|---|---|---|
| CN | 110534535 A | 12/2019 |
| CN | 111106257 A | 5/2020 |
| CN | 111341849 A | 6/2020 |
| CN | 111952341 A | 11/2020 |
| CN | 112002831 A | 11/2020 |
| CN | 112071889 A | 12/2020 |

\* cited by examiner

DISPLAY SUBSTRATE WITH MULTIPLE VIA HOLES, ELECTRONIC DEVICE, AND METHOD OF MANUFACTURING THE DISPLAY SUBSTRATE

CROSS REFERENCE TO RELATED APPLICATION(S)

This application is a Section 371 National Stage Application of International Application No. PCT/CN2021/092713, filed on May 10, 2021, the contents of which are incorporated herein by reference in their entirety.

TECHNICAL FIELD

The present disclosure relates to a field of a display technology, in particular to a display substrate, an electronic device, and a method of manufacturing a display substrate.

BACKGROUND

Organic Light Emitting Diode (OLED) is a direction of a display technology that has attracted much attention. OLED display technology has advantages of self-luminescence, high brightness, high-efficiency luminescence, fast response, low-voltage drive and low-power consumption, low cost, and few processes. The OLED technology is widely used in mobile phones, digital video cameras, DVD players, personal digital assistants (PDAs), notebook computers, car audio and televisions.

At present, an OLED display panel is increasingly developing towards high-resolution, so that a number of film layers to be fabricated needs to be continuously increased and a stacked structure needs more metal layers and more insulating layers. The insulating layer may be an organic film layer or an inorganic film layer according to a design requirement. This increasingly complex film layer structure leads to more and more complex process of a display panel, which may result in more and more problems, such as blistering and bulging of some film layers.

SUMMARY

The embodiments of the present disclosure provide a display substrate, including: a base substrate; a thin film transistor arranged on the base substrate; a first planarization layer arranged on a side of the thin film transistor away from the base substrate; a first protective layer arranged on a side of the first planarization layer away from the base substrate; a first conductive layer arranged on a side of the first protective layer away from the base substrate; and a second planarization layer arranged on a side of the first conductive layer away from the base substrate, wherein the display substrate is provided with a first via hole penetrating the first protective layer, and the first planarization layer is in contact with the second planarization layer through the first via hole.

In some embodiments, the display substrate further includes: a second protective layer arranged on the side of the first conductive layer away from the base substrate and a side of the second planarization layer facing the base substrate, wherein the first via hole penetrates the first protective layer and the second protective layer.

In some embodiments, an orthographic projection of the first via hole on the base substrate does not overlap an orthographic projection of the first conductive layer on the base substrate.

In some embodiments, the display substrate further includes a second via hole penetrating the first protective layer and the first planarization layer, wherein the first conductive layer is electrically connected to a second conductive layer through the second via hole.

In some embodiments, the second planarization layer fills the first via hole and the second via hole, and a depth of the first via hole filled with the second planarization layer is less than a depth of the second via hole filled with the second planarization layer.

In some embodiments, a width of the first via hole is less than that of the second via hole.

In some embodiments, a number of the first via hole is greater than that of the second via hole.

In some embodiments, a slope angle of the first via hole is less than that of the second via hole.

In some embodiments, the display substrate further includes an anode layer arranged on a side of the second planarization layer away from the base substrate and a third via hole electrically connected to the first conductive layer, wherein the third via hole does not overlap the first via hole.

In some embodiments, a number of the first via hole is greater than that of the third via hole.

In some embodiments, in a same pixel, an orthographic projection of the third via hole on the base substrate is located between an orthographic projection of the first via hole on the base substrate and an orthographic projection of the second via hole on the base substrate.

In some embodiments, an orthographic projection of the first via hole on the base substrate does not overlap an orthographic projection of the anode layer on the base substrate.

In some embodiments, the first conductive layer is a metal layer.

In some embodiments, the first conductive layer includes: a first metal sub-layer; a second metal sub-layer located on a side of the first metal sub-layer away from the base substrate; and a third metal sub-layer located on a side of the second metal sub-layer away from the base substrate.

The embodiments of the present disclosure further provide an electronic device, including the display substrate described in any of the aforementioned embodiments.

The embodiments of the present disclosure further provide a method of manufacturing a display substrate, including: forming a thin film transistor on a base substrate; forming a first planarization layer on the base substrate formed with the thin film transistor; forming a first protective layer on a side of the first planarization layer away from the base substrate; forming a first conductive layer on a side of the first protective layer away from the base substrate; and forming a second planarization layer on a side of the first conductive layer away from the base substrate, wherein a first via hole penetrating the first protective layer is formed, and the first planarization layer is in contact with the second planarization layer through the first via hole.

In some embodiments, a second protective layer is formed on the side of the first conductive layer away from the base substrate after the first conductive layer is formed and before the second planarization layer is formed, at least a part of the first via hole is formed in a step of forming the second protective layer, and the first via hole penetrates the first protective layer and the second protective layer.

In some embodiments, a first hollow portion of the first protective layer is formed in a step of forming the first protective layer and a second hollow portion of the second protective layer is formed in a step of forming the second protective layer, an orthographic projection of the first hollow portion on the base substrate at least partially overlaps an orthographic projection of the second hollow portion on the base substrate, and the first via hole is at least partially formed by the first hollow portion and the second hollow portion.

In some embodiments, a first hollow portion of the first protective layer and a second hollow portion of the second protective layer are formed in a step of forming the second protective layer, an orthographic projection of the first hollow portion on the base substrate at least partially overlaps an orthographic projection of the second hollow portion on the base substrate, and the first via hole is at least partially formed by the first hollow portion and the second hollow portion.

In some embodiments, a third hollow portion of the second protective layer is further formed, in a step of forming the second protective layer, to form a conductive via hole connected to the first conductive layer, and a part of the first conductive layer exposed from the third hollow portion is over-etched.

In some embodiments, an orthographic projection of the first via hole on the base substrate does not overlap an orthographic projection of the first conductive layer on the base substrate.

In some embodiments, the method further includes: forming an anode layer on a side of the second planarization layer away from the base substrate, wherein an orthographic projection of the first via hole on the base substrate does not overlap an orthographic projection of the anode layer on the base substrate.

In some embodiments, the first via hole does not overlap a light emitting area of the display substrate.

BRIEF DESCRIPTION OF THE DRAWINGS

In order to more clearly explain the technical solutions in the embodiments of the present disclosure, the drawings of the embodiments will be briefly introduced below. It should be noted that the drawings in the following description are only some embodiments of the present disclosure, and are not intended to limit the present disclosure.

DETAILED DESCRIPTION OF EMBODIMENTS

Figure 1:
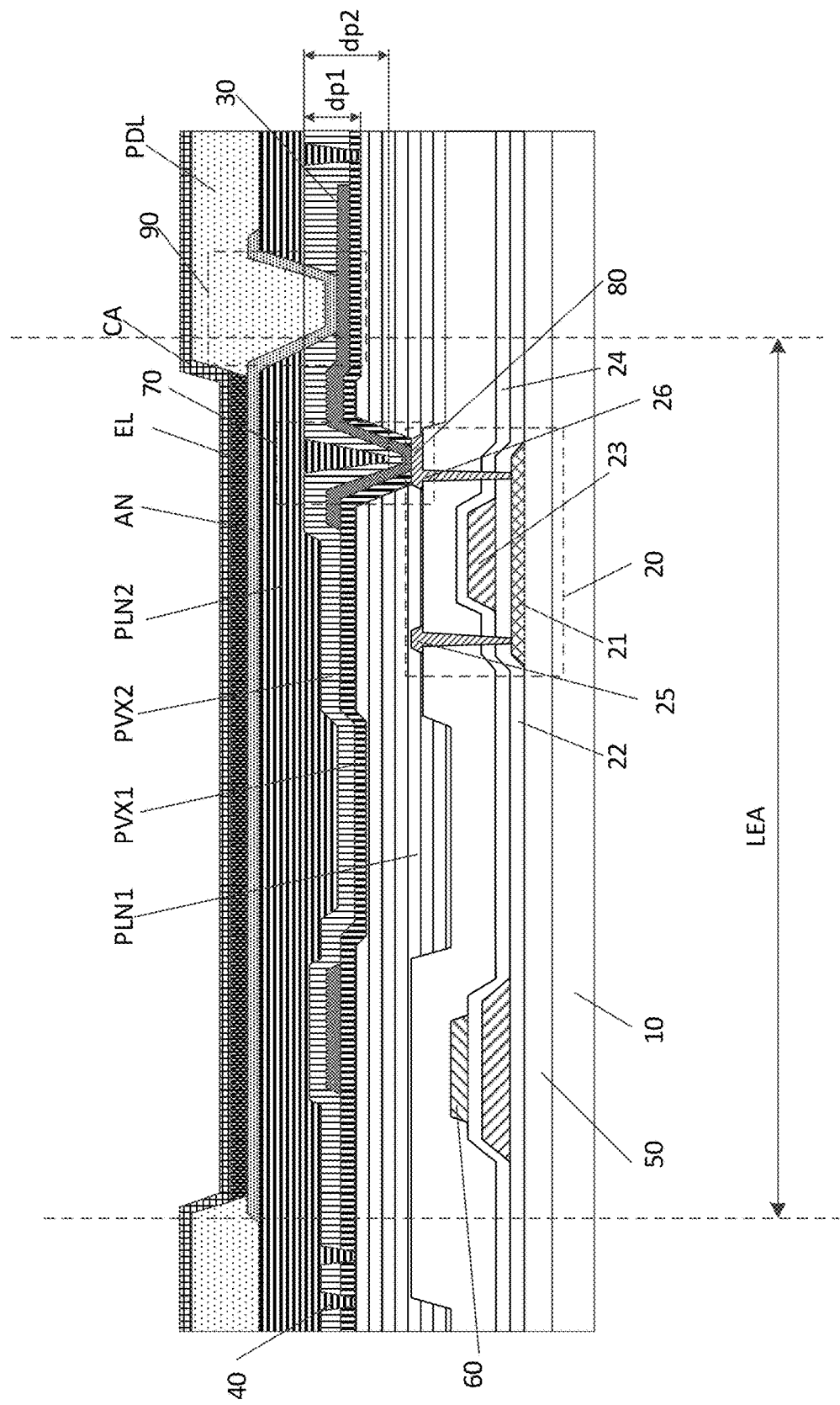
FIG. 1 shows a schematic diagram of a film layer structure of a display substrate according to some embodiments of the present disclosure.

In order to make the objectives, technical solutions and advantages of the present disclosure more apparent, the embodiments of the present disclosure will be described below with reference to the drawings. It should be understood that the following description of the embodiments is intended to explain and illustrate a general idea of the present disclosure, and should not be construed as limiting the present disclosure. In the description and the drawings, the same or similar reference numerals indicate the same or similar components or members. For clarity, the drawings are not necessarily drawn in proportion, and some known components and structures may be omitted in the drawings.

Unless otherwise defined, technical terms or scientific terms used in the present disclosure shall be of the general meaning understood by the ordinary skilled in the art. The words "first," "second," and the like used in the present disclosure do not denote any order, quantity or importance, but are used to distinguish different composite parts. The word "a", "an" or "one" does not exclude a plurality. The words "comprising," "including" and the like indicate that the element or item preceding the word encompasses the elements or items listed following the word as well as the equivalents, but do not exclude other elements or items. The words "connected," "coupled," or the like are not limited to a physical or mechanical connection, but may include an electrical connection, whether direct or indirect. The words "upper", "lower", "left", "right", "top" or "bottom" and the like are only used to indicate relative positional relationship, and when the absolute position of the object described is changed, the relative positional relationship may also be changed accordingly. When an element such as a layer, a film, an area or a base substrate is referred to be located "above" or "below" another element, the element may be "directly" located "above" or "below" the other element, or there may be an intermediate element.

At present, with a development of an OLED display panel technology, a number of film layers to be fabricated is increasing, and a stacked structure requires more metal layers and more insulating layers, which may cause two problems, that is, an increase in an overlap (overlapping area) between the metal layers and an increase in a maximum step difference of the film layers. The increase in the overlapping area between the metal layers may cause an increase of a signal line load (RC load) and a decrease of yield. The increase in the step difference of the film layers of the display panel is not conducive to a good characteristic of an OLED device, and a life and an efficiency of the OLED device may be reduced due to an unevenness of a substrate. Therefore, a thick organic film layer may be used as an insulating layer between the metal layers. Such an organic film layer may increase a spacing between the metal layers to reduce a signal interference between overlapping portions of the metal layers, and may also be used as a planarization layer to reduce the step difference of the film layers.

FIG. 1A shows an example of a film layer structure of a display substrate according to the embodiments of the present disclosure. A display substrate 100 may include a base substrate 10, a thin film transistor 20, a first planarization layer PLN1, a first protective layer PVX1, a first conductive layer (e.g., a metal layer) 30, and a second planarization layer PLN2. The thin film transistor 20 may be arranged on the base substrate 10. The first planarization layer PLN1 may be arranged on a side of the thin film transistor 20 away from the base substrate 10. The first protective layer PVX1 may be arranged on a side of the first planarization layer PLN1 away from the base substrate 10. The first conductive layer 30 may be arranged on a side of the first protective layer PVX1 away from the base substrate 10. The display substrate 100 is provided with a first via hole 40 penetrating the first protective layer PVX1. The first via hole 40 may serve as an exhaust path. With the exhaust path, a gas (e.g., water vapor) released from the first planarization layer PLN1 may pass through the first protective layer PVX1 to discharge during a process of manufacturing the display substrate. The second planarization layer PLN2 may be arranged on a side of the first conductive layer 30 away from the base substrate 10. The first via hole 40 is connected from the second planarization layer PLN2 to the first planarization layer PLN1. The first planarization layer PLN1 is in contact with the second planarization layer PLN2 through the first via hole 40. This allows a gas from the first planarization layer PLN1 to be smoothly discharged to the second planarization layer PLN2 for a further discharge. An orthographic projection of the first via hole 40 on the base substrate 10 does not overlap an orthographic projection of the first conductive layer 30 on the base substrate 10.

In some embodiments, a second protective layer PVX2 may be further provided. The second protective layer PVX2 is arranged on a side of the first conductive layer 30 away from the base substrate 10 and on a side of the second planarization layer PLN2 facing the base substrate 10. In other words, the second protective layer PVX2 may be located between the second planarization layer PLN2 and the first conductive layer 30. In this case, the first via hole 40 may penetrate the first protective layer PVX1 and the second protective layer PVX2.

In some embodiments, the aforementioned first planarization layer PLN1 is a thick organic film layer, and a thickness may reach, for example, tens of micrometers, such as 20 micrometers. When the first conductive layer 30 is formed by deposition (especially by sputtering), if the first conductive layer 30 is directly deposited on the first planarization layer PLN1, the first planarization layer PLN1 may be damaged and peeled off during the deposition of the first conductive layer 30, which may contaminate a chamber for depositing the first conductive layer 30. In order to avoid this situation, after forming the first planarization layer PLN1, an inorganic film layer (that is, the first protective layer PVX1) may be formed to protect the first planarization layer PLN1, and then the first conductive layer 30 may be deposited and patterned. Then, an inorganic protective film (that is, the second protective layer PVX2) for protecting the first conductive layer 30, as well as the second planarization layer PLN2, an anode layer AN and a pixel defining layer PDL may be further fabricated.

When fabricating according to the aforementioned process, a high temperature baking process of the second planarization layer PLN2 and a high temperature annealing process of the anode layer AN usually cause a continuous release (or called exhaust) of water vapor in an organic film of the first planarization layer PLN1. The first planarization layer PLN1 is enclosed by the first protective layer PVX1, the second protective layer PVX2 and even the first conductive layer (for example, metal layer) 30. Without providing a path for the exhaust of the first planarization layer PLN1, the water vapor released from the planarization layer PLN1 may cause a defect such as bulging or film breaking (film layer falling off) of the first protective layer PVX1, the second protective layer PVX2 and even the anode layer AN. This defect not only affects a normal light emission of a pixel, but is also unfavorable to a reliability of the display panel. Therefore, the embodiments of the present disclosure provide the first via hole 40 penetrating the first protective layer PVX1 and the second protective layer PVX2. The first via hole 40 may allow the water vapor released from the first planarization layer PLN1 to pass through the first protective layer PVX1 and the second protective layer PVX2 to discharge during the process of manufacturing the display substrate (for example, during the high temperature baking process of the second planarization layer PLN2 or the high temperature annealing process of the anode layer AN), which may avoid the above-mentioned defect such as bulging and falling off of the film layer.

In some embodiments, the display substrate may further include a second planarization layer PLN2. As an example, the first protective layer PVX1 and the second protective layer PVX2 are relatively dense inorganic layers, for example, made of a material such as SiNx. The first protective layer PVX1, the second protective layer PVX2 and the first conductive layer 30 are all film layers through which water vapor may not easily pass. The second planarization layer PLN2 may be, for example, an organic layer (for example, made of resin) through which water vapor may pass. Therefore, the first via hole 40 is connected from the second planarization layer PLN2 to the first planarization layer PLN1, and an exhaust path for the gas (for example, water vapor) released from the first planarization layer PLN1 may be build. The orthographic projection of the first via hole 40 on the base substrate 10 not overlapping the orthographic projection of the first conductive layer 30 on the base substrate 10 means that the first via hole 40 may avoid the first conductive layer 30 so that the released gas may be discharged smoothly.

In some embodiments, a second via hole 70 penetrating the first protective layer PVX1 and the first planarization layer PLN1 may be further provided, and the first conductive layer 30 is electrically connected to the second conductive layer 80 through the second via hole 70. The second via hole 70 may be used to achieve an electrical connection of the thin film transistor to the first conductive layer 30 (and further to a structure such as the anode layer AN).

In some embodiments, the second planarization layer PLN2 fills the first via hole 40 and the second via hole 70, and a depth dp1 of the first via hole 40 filled with the second planarization layer PLN2 is less than a depth dp2 of the second via hole 70 filled with the second planarization layer PLN2. This indicates that a depth of the first via hole 40 is less than that of the second via hole 70. The setting of the first via hole 40 may not cause an obstacle in the process, nor does it affect a planarization effect of the second planarization layer PLN2.

In some embodiments, a width of the first via hole 40 is less than that of the second via hole 70. In other words, a diameter of the first via hole 40 for forming the exhaust path is less than that of the second via hole 70. In some embodiments, a plurality of first via holes 40 may be provided. For example, a number of the first via hole 40 may be greater than a number of the second via hole 70, which means that the exhaust path may be achieved by a plurality of small via holes in different positions, so as to achieve a better exhaust effect. In some embodiments, a slope angle of the first via hole 40 may be, for example, less than that of the second via hole 70. In some embodiments, the display substrate may further include an anode layer AN arranged on a side of the second planarization layer PLN2 away from the base substrate 10, and an orthographic projection of the first via hole 40 on the base substrate 10 does not overlap an orthographic projection of the anode layer AN on the base substrate 10. The anode layer AN may also block the exhaust of the gas released from the first planarization layer PLN1 or the second planarization layer PLN2. Therefore, the exhaust may be more effective if the first via hole 40 avoids the anode layer AN. It should be noted that this does not mean that the orthographic projection of the first via hole 40 on the base substrate 10 and the orthographic projection of the anode layer AN on the base substrate 10 must not overlap at all in all embodiments of the present disclosure. For example, in some alternative embodiments, the orthographic projection of the first via hole 40 on the base substrate 10 may partially overlap the orthographic projection of the anode layer AN on the base substrate 10, as long as the exhaust function may be achieved. As an example, the anode layer AN may include a composite stacked structure, for example, composed of an indium tin oxide (ITO) layer, a silver layer, and an indium tin oxide layer in sequence. As an example, the display substrate may further include a third via hole 90 electrically connected to the first conductive layer 30. The third via hole 90 does not overlap the first via hole 40. The third via hole 90 may be used to achieve an electrical connection between the first conductive layer 30 and the anode layer AN. The first via hole 40 and the third via hole 90 are staggered to avoid an influence of the first conductive layer 30 and the anode layer AN on the exhaust path. In some embodiments, a plurality of first via holes 40 may be provided. For example, the number of the first via hole 40 is greater than the number of the third via hole 90.

In some embodiments, in a same pixel, an orthographic projection of the third via hole 90 on the base substrate 10 is located between an orthographic projection of the first via hole 40 on the base substrate 10 and an orthographic projection of the second via hole 70 on the base substrate 10. The first via hole 40 is located on a side of the third via hole 90 away from the second via hole 70, so as to minimize an influence of the exhaust path on a pixel circuit. In some embodiments, in order to form the first via hole 40, a first hollow portion 41 may be provided in the first protective layer PVX1, and a second hollow portion 42 may be provided in the second protective layer PVX2. An orthographic projection of the second hollow portion 42 on the base substrate 10 at least partially overlaps an orthographic projection of the first hollow portion 41 on the base substrate 10. The first via hole 40 may pass through the first hollow portion 41 in the first protective layer PVX1 and the second hollow portion 42 in the second protective layer PVX2. Therefore, the first via hole 40 may avoid a blocking of a solid part of the first protective layer PVX1 and the second protective layer PVX2. In some embodiments, the first hollow portion 41 in the first protective layer PVX1 and the second hollow portion 42 in the second protective layer PVX2 may be formed in a same process step (for example, formed in a same etching step), while in other embodiments, the first hollow portion 41 in the first protective layer PVX1 and the second hollow portion 42 in the second protective layer PVX2 may be formed in two steps, respectively.

In some embodiments of the present disclosure, as shown in FIG. 1, the thin film transistor 20 may include an active layer 21, a first insulating layer 22, a gate layer 23, a second insulating layer 24, a source electrode 25 and a drain electrode 26. The first insulating layer 22 is located on a side of the active layer 21 away from the base substrate 10. The gate layer 23 is located on a side of the active layer 21 away from the base substrate 10. The second insulating layer 24 is located on a side of the gate layer 23 away from the base substrate 10. The source electrode 25 and the drain electrode 26 are located on a side of the second insulating layer 24 away from the base substrate 10. The first conductive layer 30 may be electrically connected to the drain electrode 26. However, it should be understood that the source electrode 25 and the drain electrode 26 are interchangeable, and thus the first conductive layer 30 may also be electrically connected to the source electrode 25. As an example, the aforementioned second conductive layer 80 may be at least a part of the source electrode 25 or the drain electrode 26.

It should be noted that the above only gives an example of the thin film transistor, and the thin film transistor in the embodiments of the present disclosure is not limited to the above example.

In the embodiments of the present disclosure, the first conductive layer 30 may be used, for example, for routing wires to improve a pixel density on the display substrate, which is useful for achieving a high-resolution display panel. In some embodiments, the first conductive layer may include a first metal sub-layer 31, a second metal sub-layer 32 and a third metal sub-layer 33. The second metal sub-layer 32 may be located on a side of the first metal sub-layer 31 away from the base substrate 10, and the third metal sub-layer 33 may be located on a side of the second metal sub-layer 31 away from the base substrate 10. For example, the first metal sub-layer 31 may be made of titanium, the second metal sub-layer 32 may be made of aluminum, and the third metal sub-layer 33 may also be made of titanium. As an example, a thickness of the second metal sub-layer 32 may be greater than that of the first metal sub-layer 31 and that of the third metal sub-layer 33. For example, the thickness of the second metal sub-layer 32 may be more than five times greater than that of the first metal sub-layer 31 or the third metal sub-layer 33.

In some embodiments, the display substrate may further include other film layers, such as a buffer layer 50, a luminescent material layer EL, a cathode layer CA, a pixel defining layer PDL, etc. arranged on the base substrate 10. The anode layer AN, the cathode layer CA, and the luminescent material layer EL sandwiched between the anode layer AN and the cathode layer CA may constitute a light emitting device to achieve an image display function. As an example, the first planarization layer PLN1 and the second planarization layer PLN2 may have a large thickness, for example, more than 2 microns. The display substrate may further include, for example, a metal layer such as another electrode layer 60 for achieving a storage electrode.

The embodiments of the present disclosure further provide a display panel including the display substrate according to the present application.

Figure 2:
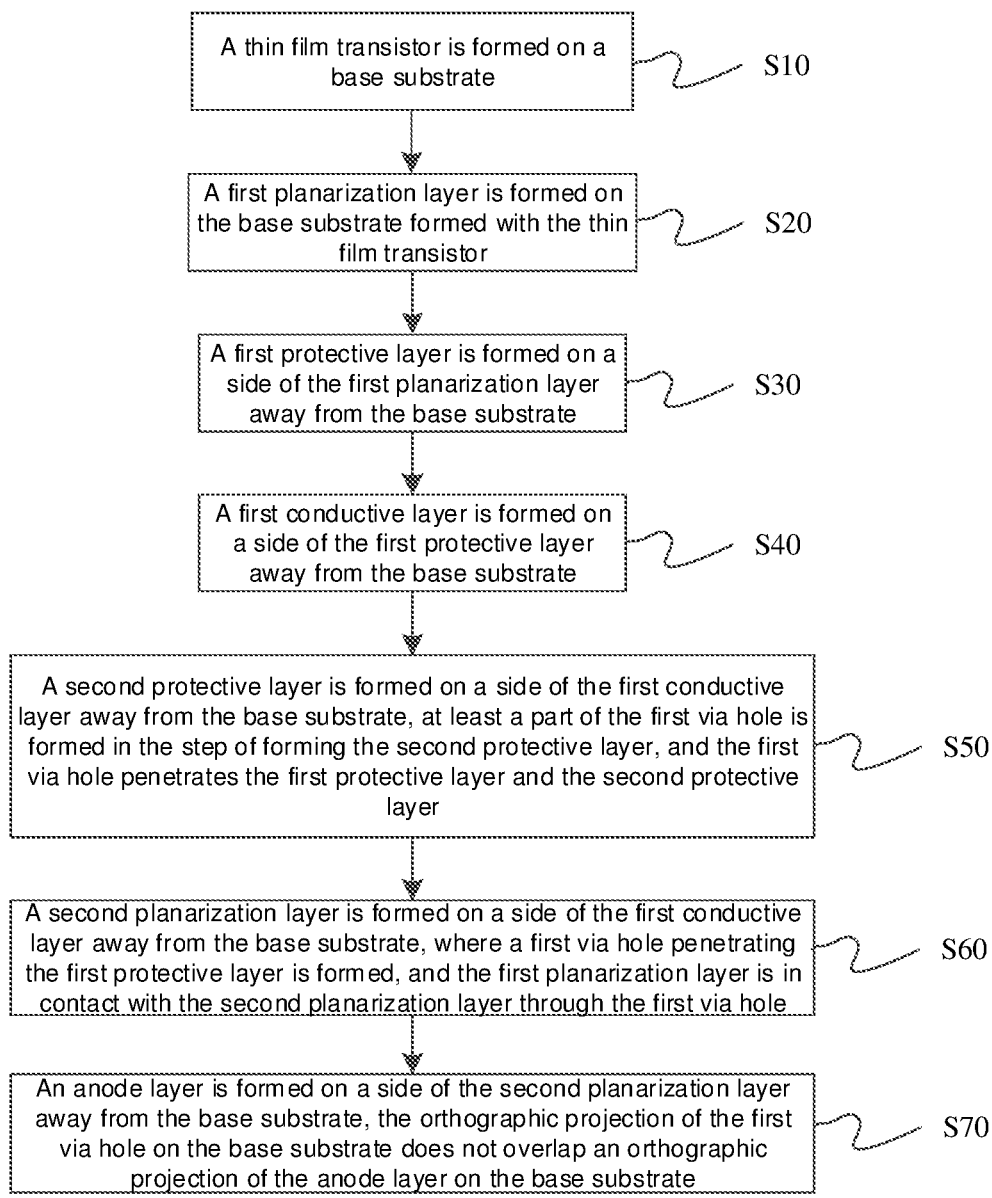
FIG. 2 shows a schematic flowchart of a method of manufacturing a display substrate according to some embodiments of the present disclosure.

FIG. 2 shows a method of manufacturing a display substrate according to the embodiments of the present disclosure. The method includes the following steps. In step S10, a thin film transistor is formed on a base substrate. In step S20, a first planarization layer is formed on the base substrate formed with the thin film transistor. In step S30, a first protective layer is formed on a side of the first planarization layer away from the base substrate. In step S40, a first conductive layer is formed on a side of the first protective layer away from the base substrate. In step S60, a second planarization layer is formed on a side of the first conductive layer away from the base substrate, where a first via hole penetrating the first protective layer is formed, and the first planarization layer is in contact with the second planarization layer through the first via hole.

In some embodiments, the method may further include step S50, in which a second protective layer is formed on a side of the first conductive layer away from the base substrate after the first conductive layer is formed and before the second planarization layer is formed, at least a part of the first via hole is formed in the step of forming the second protective layer, and the first via hole penetrates the first protective layer and the second protective layer.

In some embodiments, an orthographic projection of the first via hole on the base substrate does not overlap an orthographic projection of the first conductive layer on the base substrate.

Figure 3A:
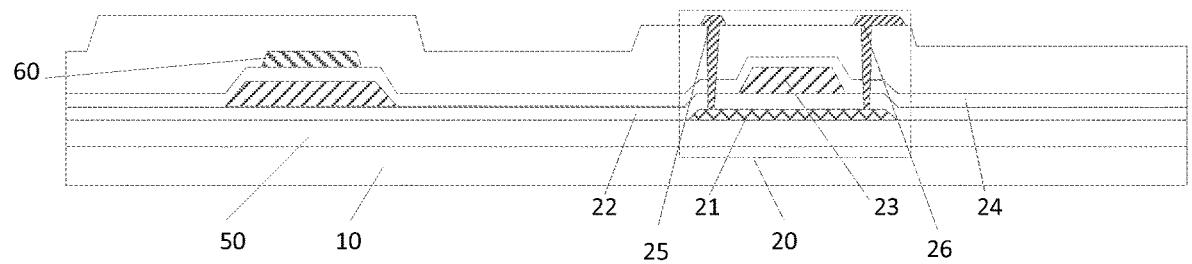
FIG. 3A, FIG. 3B, FIG. 3C, FIG. 3D, FIG. 3E, FIG. 3F and FIG. 3G schematically show structures obtained at various steps in a process of manufacturing a display substrate according to some embodiments of the present disclosure.

FIG. 3A to FIG. 3E show schematic diagrams of structures obtained after various steps in an example of a method of manufacturing a display substrate using the above steps. FIG. 3A shows step S10 of forming the thin film transistor on the base substrate. This step S10 is the same as a formation process of a thin film transistor in a related art, and a corresponding pattern is formed according to an actual process and pixel circuit, which will not be repeated here.

Figure 3B:
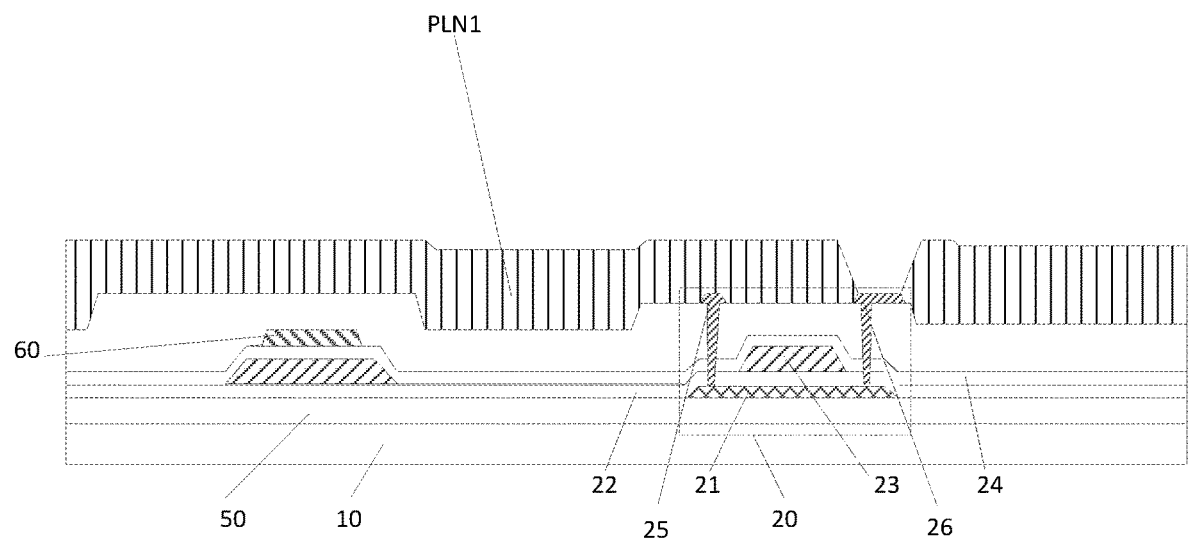

FIG. 3B shows the step of fabricating the first planarization layer PLN1, that is, step S20. The first planarization layer PLN1 may be formed, for example, by laying an organic adhesive (such as resin) having a leveling property, and therefore contains a lot of moisture. For example, a process of drying the base substrate may be performed prior to fabricating the first planarization layer PLN1, and a baking process may be performed to remove most of the moisture after the first planarization layer PLN1 is fabricated. However, some water vapor may still remain after the first planarization layer PLN1 is formed. As shown in FIG. 3B, when patterning the first planarization layer PLN1, a hole may be dug at a position corresponding to the drain electrode 26 (or source electrode), to form the second via hole 80 for electrically connecting the first conductive layer 30 and the drain source 26 in a subsequent step.

Figure 3C:
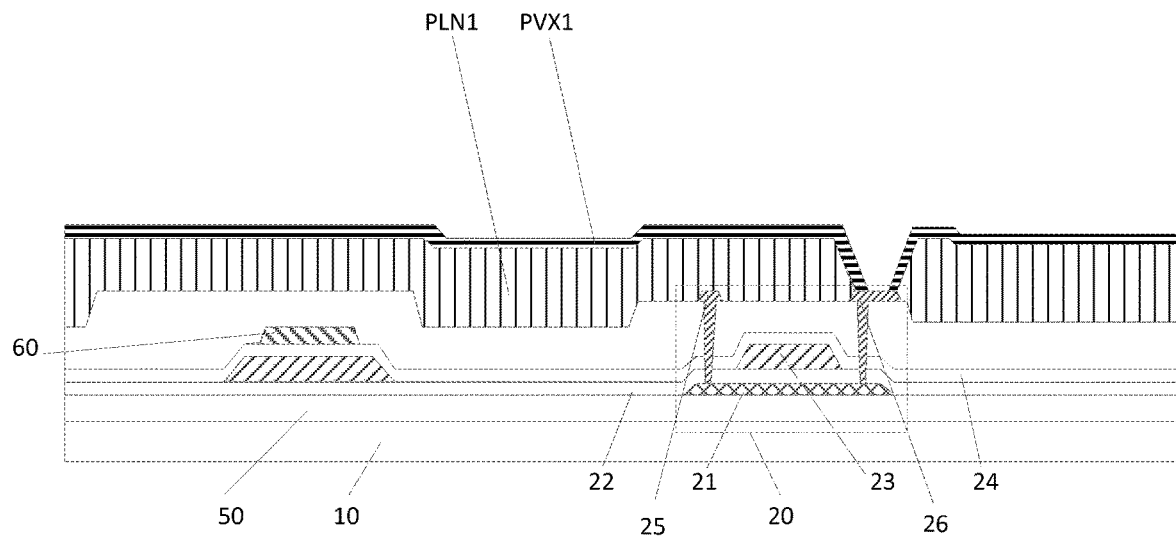

FIG. 3C shows the step of fabricating the first protective layer PVX1, that is, step S30. The first protective layer PVX1 mainly functions to protect the first planarization layer PLN1 from being damaged or peeled off by the deposition process of the first conductive layer when the first conductive layer (for example, metal layer) 30 is subsequently deposited. If a part of the first planarization layer PLN1 is peeled off, the peeled part is a foreign matter in the device and may contaminate the chamber and affect the yield. As an example, a thickness of the first protective layer PVX1 may be, for example, 50 nm to 100 nm, which is much thinner than the first planarization layer PLN1. In the example shown in FIG. 3C, when patterning the first protective layer PVX1, the hole is only dug at the position corresponding to the drain electrode 26 (or source electrode) to form a via hole structure for electrically connecting the first conductive layer 30 and the drain electrode 26, without fabricating a hollow portion for forming the first via hole 40. This may prevent the first planarization layer PLN1 from being partially exposed in the subsequent deposition of the first conductive layer due to the formation of the exhaust path, so as to prevent the exposed part of the first planarization layer PLN1 from contaminating the chamber for deposition.

Figure 3D:
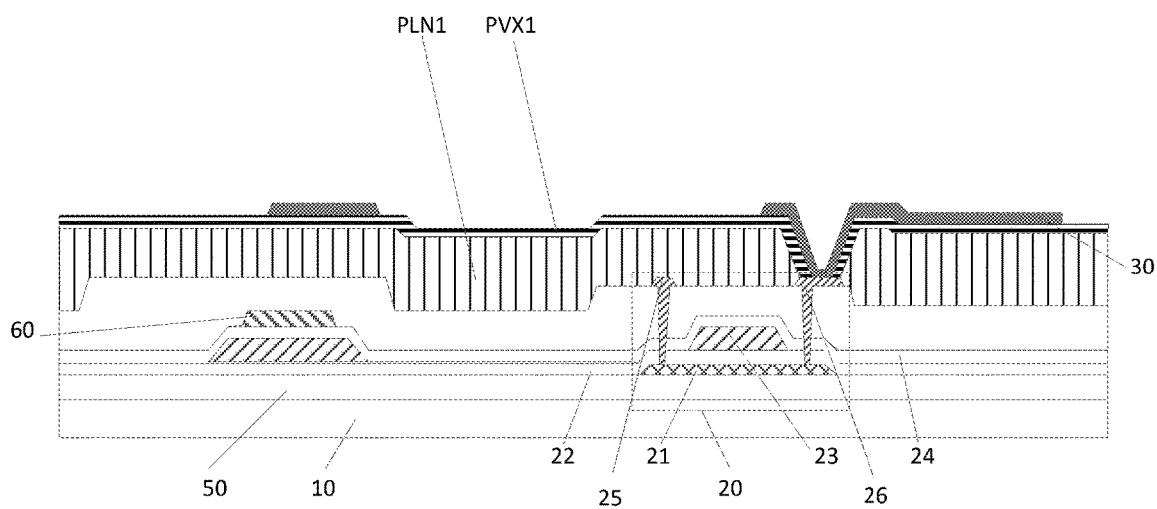

FIG. 3D shows the step of fabricating the first conductive layer 30, that is, step S40. In the film layers on the display substrate, the first conductive layer 30 has a relatively complex structure and may overlap much with a thin film transistor circuit. One of important purposes of providing the first planarization layer PLN1 is to suppress a signal interference between the first conductive layer 30 and the thin film transistor circuit in other layers. As shown in FIG. 3D, when depositing the first conductive layer 30, the first planarization layer PLN1 is completely covered by the first protective layer PVX1 without being exposed, and thus may not contaminate the deposition chamber. In this step S40, a via hole structure (that is, the second via hole 70) for electrically connecting the first conductive layer 30 and the drain source 26 is formed.

Figure 3E:
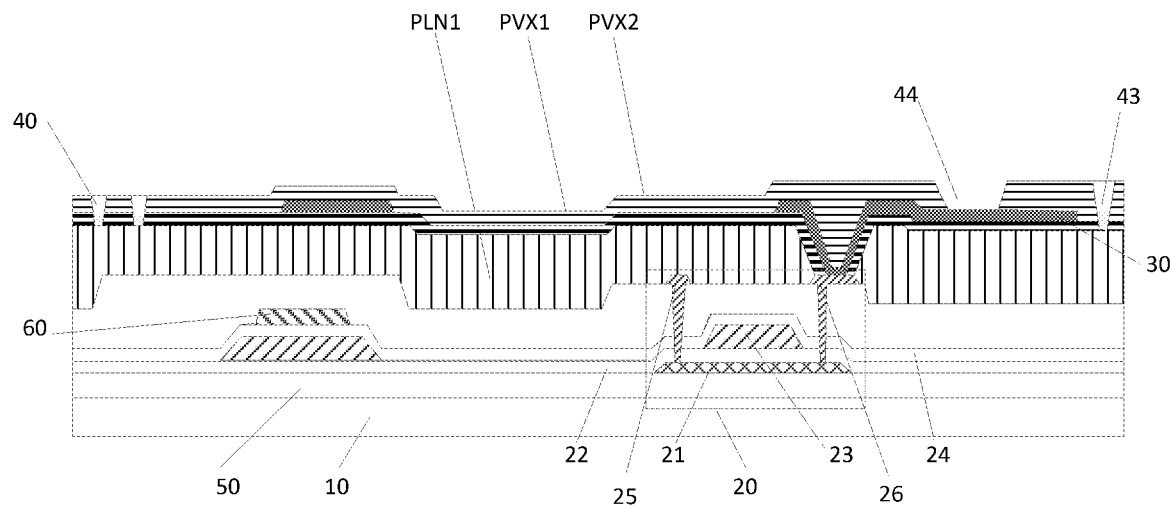

FIG. 3E shows the step of fabricating the second protective layer PVX2, that is, step 50. In this step, not only the via hole for electrically connecting the anode layer AN and the first conductive layer 30 is designed, but also the first via hole 40 for exhausting the gas released from the first planarization layer PLN1 is formed. Since the first via hole 40 needs to penetrate the first protective layer PVX1 and the second protective layer PVX2 (for example, at a position 43 in FIG. 3E), it is necessary to continuously etch through the two protective layers in step 50 in order to form the first via hole 40. However, it is only needed to etch through the second protective layer PVX2 (for example, at a position 44 in FIG. 3E) in order to form the via hole electrically connecting the anode layer AN and the first conductive layer 30. This means that two depths of etching are required in step 50. Then, in order to ensure that both the first protective layer PVX1 and the second protective layer PVX2 are etched away at the position 43, there may necessarily have an over-etch amount at the position 44. That is, a part of the first conductive layer 30 may be etched away after the second protective layer PVX2 is etched away. This over-etch amount needs to ensure that the first protective layer PVX1 and the second protective layer PVX2 are etched through to form the first via hole 40, and further ensure that a good electrical connection between the anode layer AN and the first conductive layer 30 is not hurt.

Therefore, the thickness of the first protective layer PVX1 and the thickness of the first conductive layer 30 need to be set according to characteristics of different materials. For example, it is assumed that the first conductive layer 30 includes three metal sub-layers sequentially made of titanium, aluminum and titanium. In this case, the above-mentioned over-etch amount needs to ensure that the titanium layer on top of the first conductive layer 30 is not etched through, otherwise the exposed aluminum layer may be easily oxidized to reduce the electrical connection performance. In some embodiments, the first protective layer PVX1 and the second protective layer PVX2 are made of $SiN_x$ or $SiO_x$. A gas for etching $SiN_x$ or $SiO_x$ generally has a poor corrosivity to metal titanium, and the over-etch amount may be small. However, in the process of etching the first protective layer PVX1 and the second protective layer PVX2, the etching process may include a physical atom bombardment, which may cause a damage to a surface of the metal titanium, but in this case, a thickness of 300 angstroms or more of the titanium layer may cope with a conventional over-etch amount of the first protective layer PVX1. As an example, when the thickness of the first protective layer PVX1 is within 100 nm (such as 50 nm), the electrical connection performance may be ensured as long as the titanium layer has a thickness of 50 nm or more. For another example, when the thickness of the first protective layer PVX1 is 150 nm, the electrical connection performance may be ensured as long as the titanium layer has a thickness of 70 nm or more.

In some further embodiments, the method may further include step S70, in which an anode layer is formed on a side of the second planarization layer away from the base substrate, where the orthographic projection of the first via hole on the base substrate does not overlap an orthographic projection of the anode layer on the base substrate.

Figure 3F:
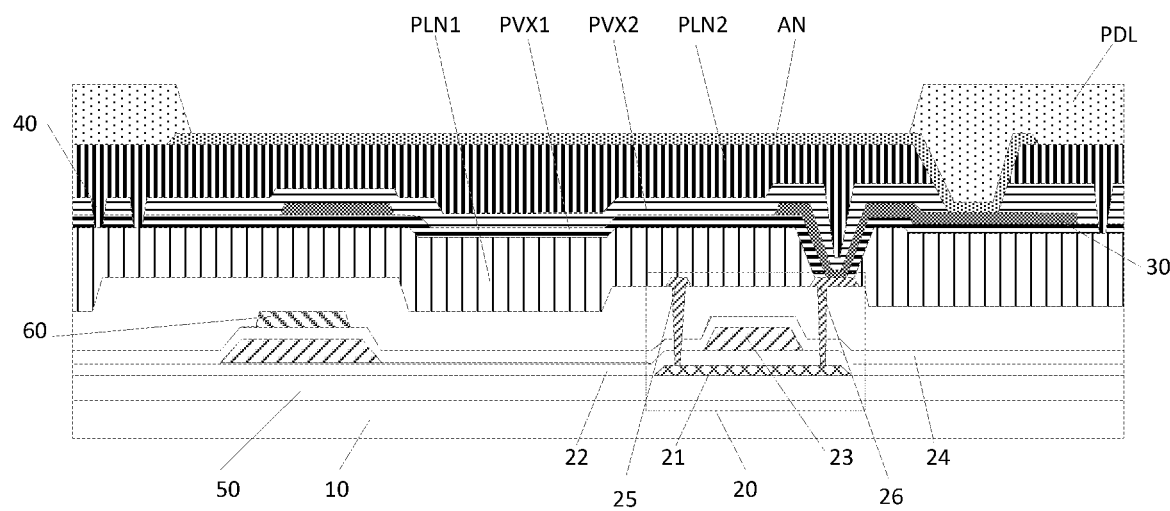

FIG. 3F shows the steps of forming the second planarization layer PLN2, the anode layer AN and the pixel defining layer PDL. High temperature processes are involved in the process of fabricating the second planarization layer PLN2, the anode layer AN and the pixel defining layer PDL, and these high temperature processes may cause the first planarization layer PLN1 to release gas again. Therefore, the first via hole 40 is important for these steps. As clearly shown in FIG. 3F, the first via hole 40 avoids the first conductive layer 30 and the anode layer AN.

Figure 3G:
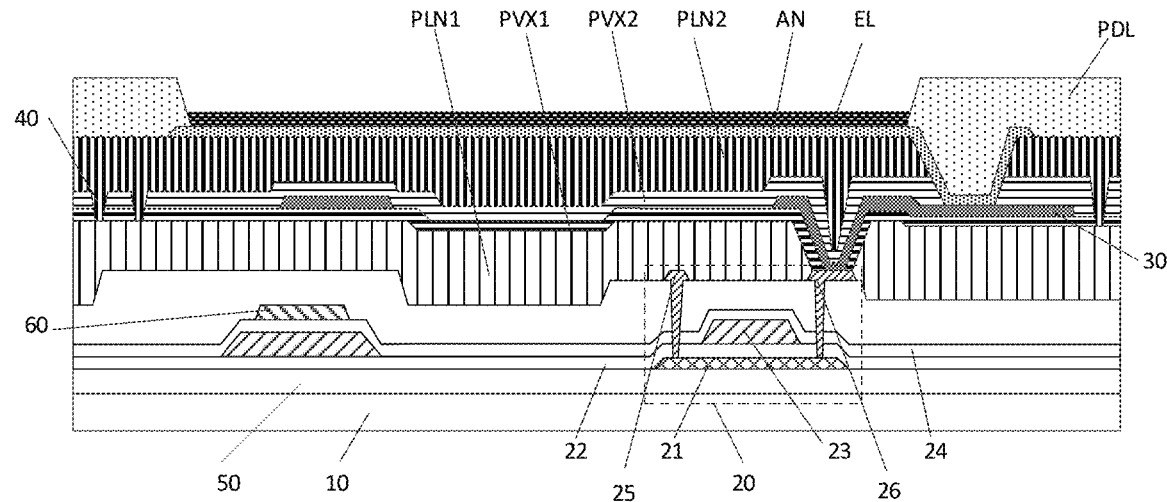

FIG. 3G shows a step of forming a luminescent material layer EL, which may be formed on a side of the anode layer AN away from the base substrate 10. In the process of fabricating the luminescent material layer EL, the temperature is generally low and typically does not exceed the temperature in the baking process of the first planarization layer PLN1. In addition, after a series of previous high-temperature processes, the water vapor in the first planarization layer PLN1 is almost eliminated, and the subsequent exhaust may hardly cause a film bubble issue.

Figure 4A:
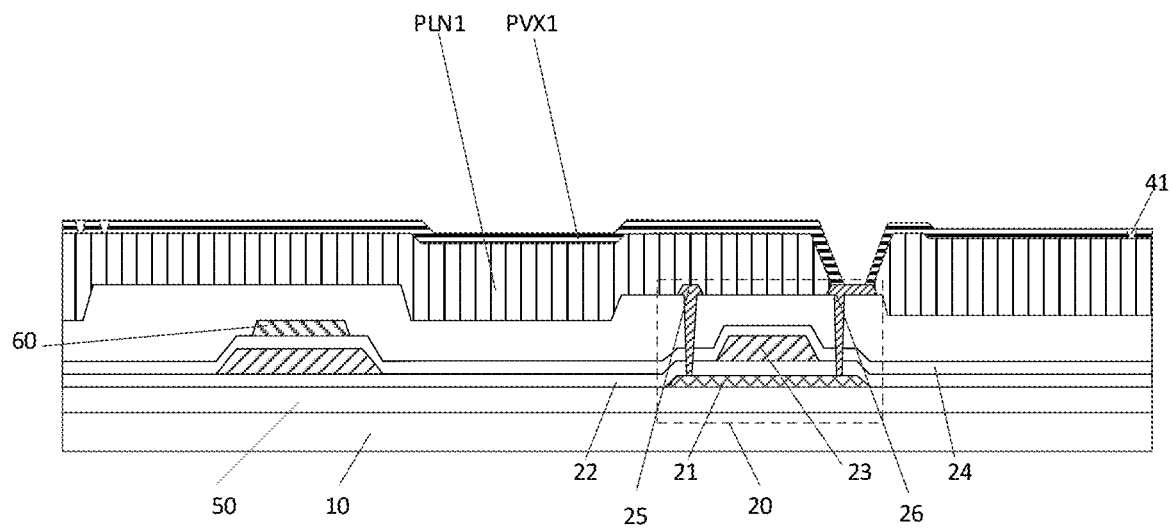
FIG. 4A and FIG. 4B schematically show structures obtained at some steps in a process of manufacturing a display substrate according to some other embodiments of the present disclosure.
Figure 4B:
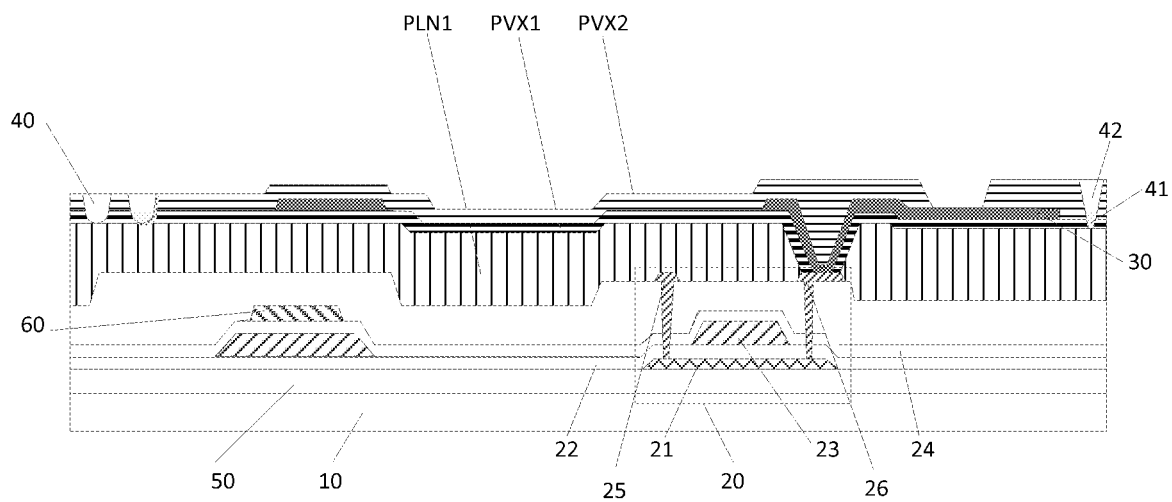
Figure 5:
FIG. 5 schematically shows an example of a structure of a first conductive layer.

FIG. 4A and FIG. 4B show an alternative example of the method of manufacturing the display substrate according to the embodiments of the present disclosure. In this alternative example, step S30 and step S50 are different from the above examples shown in FIG. 3A to FIG. 3E. In the above examples shown in FIG. 3A to FIG. 3E, the first hollow portion 41 of the first protective layer PVX1 and the second hollow portion 42 of the second protective layer PVX2 are formed in the step of forming the second protective layer PVX2, the orthographic projection of the first hollow portion 41 on the base substrate at least partially overlaps (for example, completely overlaps) the orthographic projection of the second hollow portion 42 on the base substrate 10, and the exhaust path 40 is at least partially formed by the first hollow portion 41 and the second hollow portion 42. However, in the alternative example shown in FIG. 4A and FIG. 4B, the first hollow portion 41 of the first protective layer PVX1 is formed in the step of forming the first protective layer PVX1, and the second hollow portion 42 of the second protective layer PVX2 is formed in the step of forming the second protective layer PVX2. In other words, in the aforementioned examples, the first via hole 40 is etched in one step, while in the alternative example, the first via hole 40 is etched in steps.

Specifically, as shown in FIG. 4A, in step S30, when patterning the first protective layer PVX1, the first hollow portion 41 is formed at a position corresponding to the first via hole 40. In step S50, since the first protective layer PVX1 has been etched at the position corresponding to the first via hole 40, the over-etch amount is not required when etching the second protective layer PVX2, and it is only needed to etch through the second protective layer PVX2, which may avoid considering the over-etching of the first conductive layer 30 and simplify a process complexity. The aforementioned solution of etching the first via hole 40 in one step may completely avoid the contamination of the first planarization layer PLN1 to the first conductive layer deposition chamber. In a case that the contamination of the first planarization layer PLN1 to the first conductive layer deposition chamber is controllable, the above-mentioned solution of forming the first via hole 40 by etching in steps may also be considered.

In some embodiments, in the above-mentioned solution of forming the first hollow portion 41 and the second hollow portion 42 together in the step of forming the second protective layer PVX2, a third hollow portion (located at position 44 in FIG. 3E) of the second protective layer PVX2 is further formed in the step of forming the second protective layer PVX2. The third hollow portion is used to form a conductive via hole, and a part of the first conductive layer 30 exposed from the third hollow portion is over-etched.

In the embodiments of the present disclosure, the first via hole 40 does not overlap a light emitting area LEA (an area where the light emitting device is located as shown in FIG. 1) of the display substrate, which may avoid an influence of the light emitting area (for example, a structure such as the anode layer) on the first via hole 40. If possible, a plurality of first via holes 40 may be provided to improve the exhaust effect.

The embodiments of the present disclosure further provide an electronic device including the display substrate or the display panel according to any one of the embodiments described above. In the embodiments of the present disclosure, the electronic device may include any electronic device with a display function, such as a mobile phone, a notebook computer, a tablet computer, a television, a navigator, a digital photo frame, and so on.

Although the present disclosure has been described with reference to the drawings, the embodiments disclosed in the drawings are intended to exemplify the embodiments of the present disclosure, and should not be understood as a limitation of the present disclosure. Size ratios in the drawings are only schematic and should not be construed as limiting the present disclosure.

The embodiments described above merely illustrate the principle and structure of the present disclosure, but are not used to limit the present disclosure. Those skilled in the art should understand that any changes and improvements made to the present disclosure without departing from the general idea of the present disclosure fall within the scope of the present disclosure. The protection scope of the present disclosure shall be determined by the scope defined by the claims of the present disclosure.

What is claimed is:

1. A display substrate, comprising:
   a base substrate;
   a thin film transistor arranged on the base substrate;
   a first planarization layer arranged on a side of the thin film transistor away from the base substrate;
   a first protective layer arranged on a side of the first planarization layer away from the base substrate;
   a first conductive layer arranged on a side of the first protective layer away from the base substrate; and
   a second planarization layer arranged on a side of the first conductive layer away from the base substrate, wherein the display substrate is provided with a first via hole penetrating the first protective layer, and the first planarization layer is in contact with the second planarization layer through the first via hole;
   wherein the display substrate further compromises a second via hole penetrating the first protective layer and the first planarization layer, wherein the first conductive layer is electrically connected to a second conductive layer through the second via hole, the second planarization layer fills the first via hole and the second via hole, and a depth of the first via hole filled with the second planarization layer is less than a depth of the second via hole filled with the second planarization layer.

2. The display substrate of claim 1, further comprising:
   a second protective layer arranged on the side of the first conductive layer away from the base substrate and a side of the second planarization layer facing the base substrate, wherein the first via hole penetrates the first protective layer and the second protective layer.

3. The display substrate of claim 1, wherein an orthographic projection of the first via hole on the base substrate does not overlap an orthographic projection of the first conductive layer on the base substrate.

4. The display substrate of claim 1, wherein a width of the first via hole is less than that of the second via hole.

5. The display substrate of claim 1, wherein a number of the first via hole is greater than that of the second via hole.

6. The display substrate of claim 1, wherein a slope angle of the first via hole is less than that of the second via hole.

7. The display substrate of claim 1, wherein the first conductive layer is a metal layer.

8. The display substrate of claim 1, wherein the first conductive layer comprises:
   a first metal sub-layer;
   a second metal sub-layer located on a side of the first metal sub-layer away from the base substrate; and
   a third metal sub-layer located on a side of the second metal sub-layer away from the base substrate.

9. An electronic device comprising the display substrate of claim 1.

10. The display substrate of claim 8, further comprising an anode layer arranged on a side of the second planarization layer away from the base substrate and a third via hole electrically connected to the first conductive layer, wherein the third via hole does not overlap the first via hole.

11. The display substrate of claim 10, wherein a number of the first via hole is greater than that of the third via hole.

12. The display substrate of claim 10, wherein, in a same pixel, an orthographic projection of the third via hole on the base substrate is located between an orthographic projection of the first via hole on the base substrate and an orthographic projection of the second via hole on the base substrate.

13. The display substrate of claim 10, wherein an orthographic projection of the first via hole on the base substrate does not overlap an orthographic projection of the anode layer on the base substrate.

14. A method of manufacturing a display substrate, comprising:
   forming a thin film transistor on a base substrate;
   forming a first planarization layer on the base substrate formed with the thin film transistor;
   forming a first protective layer on a side of the first planarization layer away from the base substrate;
   forming a first conductive layer on a side of the first protective layer away from the base substrate; and
   forming a second planarization layer on a side of the first conductive layer away from the base substrate, wherein a first via hole penetrating the first protective layer is formed, and the first planarization layer is in contact with the second planarization layer through the first via hole;
   wherein the first protective layer and the first planarization layer is penetrated by a second via hole, the first conductive layer is electrically connected to a second conductive layer through the second via hole, the second planarization layer fills the first via hole and the second via hole, and a depth of the first via hole filled with the second planarization layer is less than a depth of the second via hole filled with the second planarization layer.

15. The method of claim 14, wherein a second protective layer is formed on the side of the first conductive layer away from the base substrate after the first conductive layer is formed and before the second planarization layer is formed, at least a part of the first via hole is formed in a step of forming the second protective layer, and the first via hole penetrates the first protective layer and the second protective layer.

16. The method of claim 15, wherein a first hollow portion of the first protective layer is formed in a step of forming the first protective layer and a second hollow portion of the second protective layer is formed in a step of forming the second protective layer, an orthographic projection of the first hollow portion on the base substrate at least partially overlaps an orthographic projection of the second hollow portion on the base substrate, and the first via hole is at least partially formed by the first hollow portion and the second hollow portion.

17. The method of claim 15, wherein a first hollow portion of the first protective layer and a second hollow portion of the second protective layer are formed in a step of forming the second protective layer, an orthographic projection of the first hollow portion on the base substrate at least partially overlaps an orthographic projection of the second hollow portion on the base substrate, and the first via hole is at least partially formed by the first hollow portion and the second hollow portion.

18. The method of claim 17, wherein a third hollow portion of the second protective layer is further formed, in a step of forming the second protective layer, to form a conductive via hole connected to the first conductive layer, and a part of the first conductive layer exposed from the third hollow portion is over-etched.

* * * * *